(12) United States Patent
Frisch

(10) Patent No.: US 7,352,204 B2
(45) Date of Patent: Apr. 1, 2008

(54) AUTOMATIC SKEW CORRECTION FOR DIFFERENTIAL SIGNALS

(75) Inventor: Arnold M. Frisch, Portland, OR (US)

(73) Assignee: Warpspeed Chips, LLC, Portland, OR (US)

( * ) Notice: Subject to any disclaimer, the term of this patent is extended or adjusted under 35 U.S.C. 154(b) by 78 days.

(21) Appl. No.: 11/413,717

(22) Filed: Apr. 28, 2006

(65) Prior Publication Data

US 2006/0256880 A1 Nov. 16, 2006

Related U.S. Application Data

(60) Provisional application No. 60/680,877, filed on May 13, 2005.

(51) Int. Cl.
*H03K 17/16* (2006.01)
*H03K 19/003* (2006.01)

(52) U.S. Cl. ............... 326/26; 326/27; 326/30; 326/86

(58) Field of Classification Search .......... 326/26–27, 326/30, 86, 9; 327/108, 109, 112
See application file for complete search history.

(56) References Cited

U.S. PATENT DOCUMENTS

| 6,686,779 | B2 | 2/2004 | Yashikawa |
| 6,734,702 | B1* | 5/2004 | Ikeoku et al. ............... 326/30 |
| 6,771,097 | B1* | 8/2004 | Poh Ho et al. ............. 327/108 |
| 6,812,777 | B2 | 11/2004 | Tamura et al. |
| 6,909,980 | B2 | 6/2005 | Fernando |
| 6,963,237 | B2 | 11/2005 | Tamura et al. |

* cited by examiner

*Primary Examiner*—Anh Q. Tran
(74) *Attorney, Agent, or Firm*—Daniel J. Bedell; Smith-Hill and Bedell

(57) ABSTRACT

A skew correction system incorporated into a transmitter forwarding a differential signal on a differential lane monitors returning signal reflections when the receiving end of the differential lane is appropriately terminated. Based on an analysis of the reflections, the skew correction system adjusts the relative timing of complementary edges of the differential signal departing the transmitter so as to substantially eliminate skew at the receiving end of the differential lane.

15 Claims, 15 Drawing Sheets

TSKEW

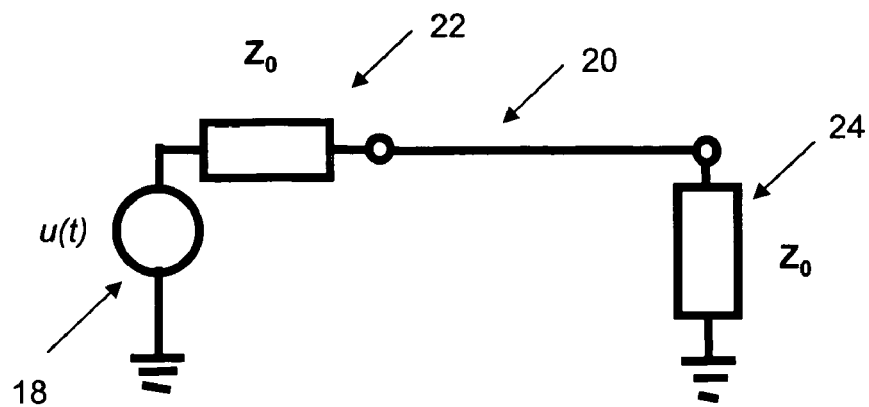
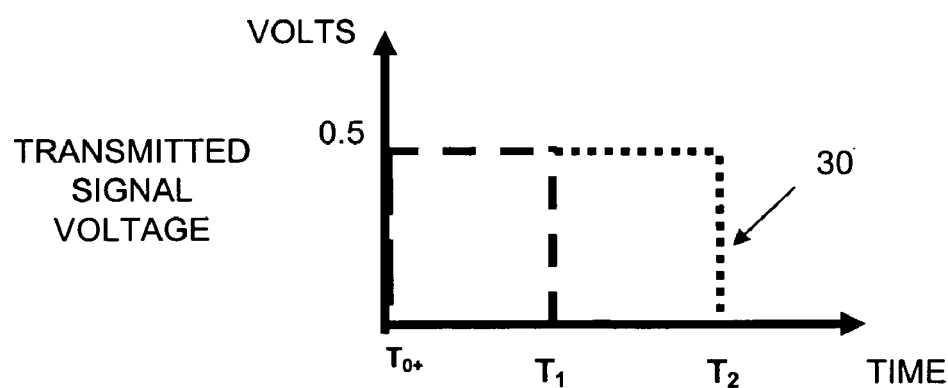
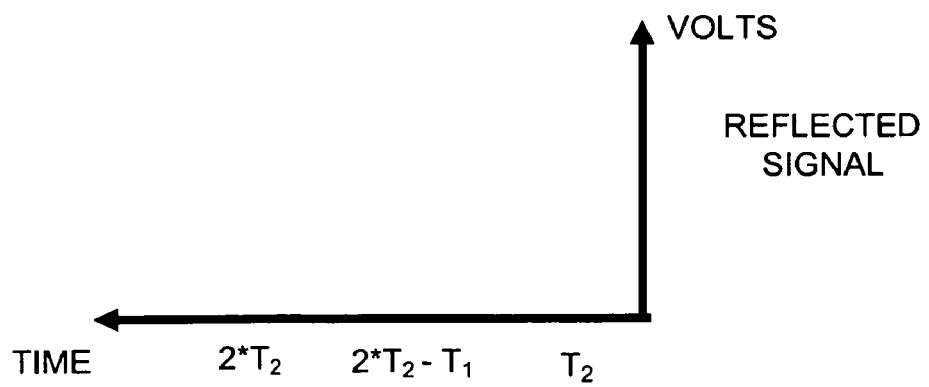
FIG 13

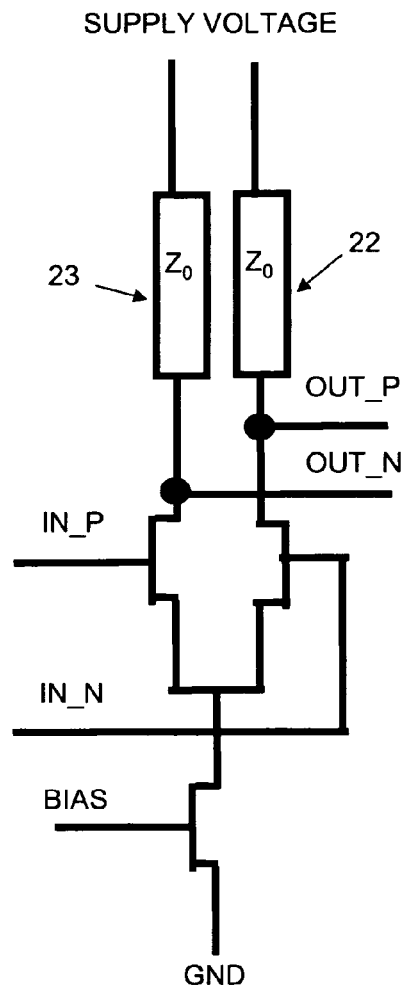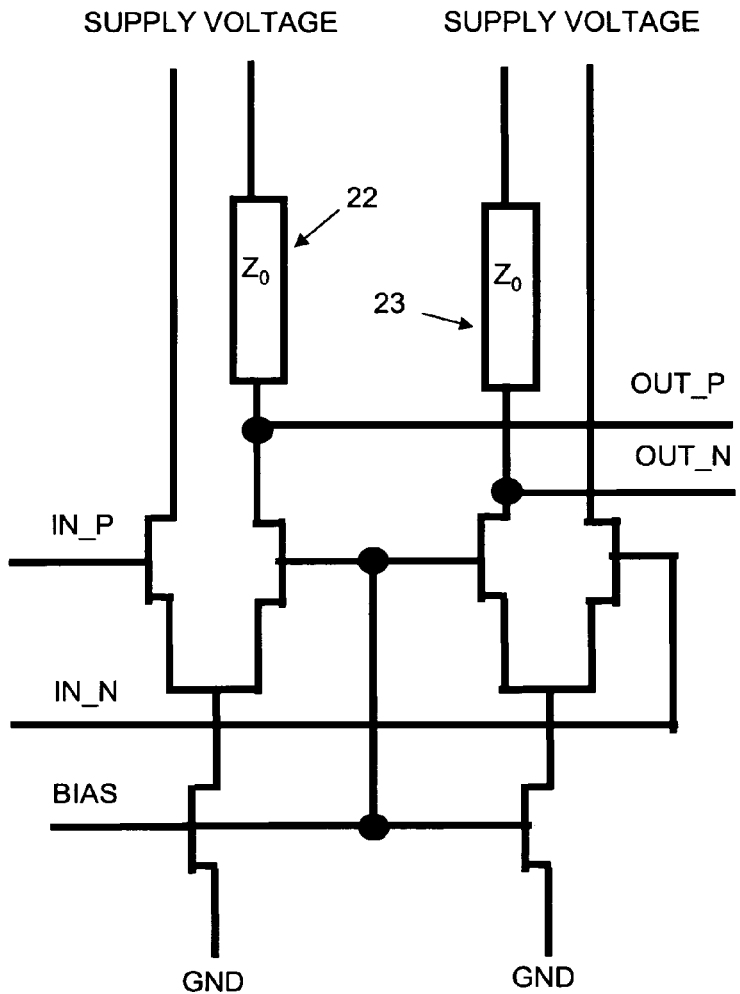
FIG 18                    FIG 19

AUTOMATIC SKEW CORRECTION FOR DIFFERENTIAL SIGNALS

CROSS-REFERENCE TO RELATED APPLICATION

This application claims benefit of U.S. Provisional Application No. 60/680,877 filed May 13, 2005, the entire disclosure of which is hereby incorporated by reference herein for all purposes.

BACKGROUND OF THE INVENTION

1. Field of the Invention

The invention relates in general to methods and circuits for sensing and correcting skew between the two signals in a differential lane.

2. Description of Related Art

In high-speed digital applications it is common to use differential inputs and outputs to interconnect integrated circuits at the next higher level of integration (e.g. circuit board or multi-chip module). The reason for this is that differential signaling offers relative immunity to noise and drift that would otherwise have negative impact on the signal integrity of the lane carrying the high-speed information.

It is, however, known that this relative immunity to noise and drift can be compromised by skew. The reason for this is that when the skew between the differential signals is sufficiently large, the receiving stage may switch as a result of the transition of (substantially) one line of the differential pair. In such a case, the drift and noise canceling features of differential signaling are nearly eliminated.

U.S. Pat. Nos. 6,812,777 and 6,963,237 issued Nov. 2, 2004 and Nov. 8, 2005, respectively, to Tamura et al describe a method and circuits for controlling the differential skew of an output circuit. This method is illustrated in his FIGS. 19 and 20, included here as FIGS. 1 and 2, by example. Tamura adjusts the duty cycle of the output signals to eliminate the differential skew. Tamura, however, assumes that the differential skew arises as a consequence of problems in the driver circuit or the output circuit that is the subject of the patent. Tamura's invention does not deal with skew introduced by interconnect between the output circuit he has de-skewed and the input circuit of another, remote, integrated circuit.

U.S. Pat. No. 6,686,779 issued Feb. 3, 2004 to Takefumi Yoshikawa describes a method for controlling the differential skew of an output circuit. Yoshikawa uses independently programmable pull down capability for the true and complement versions of the differential output, thereby providing an ability to de-skew the output circuit. Yoshikawa, however, assumes that the differential skew arises as a consequence of problems in the driver circuit or the output circuit that is the subject of the patent. Yoshikawa's invention does not deal with skew introduced by interconnect between the output circuit he has de-skewed and the input circuit of another, remote, integrated circuit.

U.S. Pat. No. 6,909,980 issued Jun. 21, 2005 to Chenjing Fernando describes a method for deciding how an article of test equipment, e.g. an oscilloscope, should adjust the timing of input differential signals to obtain optimal skew values in an eye diagram. Fernando uses independently programmable "paired independent skew circuits" for the true and complement versions of a differential input, thereby providing an ability to de-skew the signal circuit. Fernando, however, assumes that the differential skew arises as a consequence of problems in the interconnection to the test equipment and that is the subject of the patent. Fernando's invention does not deal with skew introduced by interconnect between a source and the input circuit of another, remote, integrated circuit that is not a part of the test equipment that is the subject of his invention.

In contrast to the prior art cited in the patents by Tamura et al, Yoshikawa, and Fernando, the invention described here is a method for sensing skew at the receiving end of a differential signaling lane and automatically eliminating it independently of whether it was caused by problems in the driver IC, the interconnect, or the receiver input impedance.

The circuit driving the transmitter differential signals out of a transmitter IC may introduce skew because of asymmetric driving capability or other defects such as asymmetric loading of the output or of the input of the driver. But for the most part, skew is introduced by differences in the length, or effective length, of interconnects. In the construction of media for interconnecting integrated circuits there are a variety of opportunities for inadvertently introducing skew. If a pair of differential lines have to be routed between a transmitter and a receiver, it can at times be very difficult to ensure that the two lines have the same effective length because of length differences or differences in bends and corners in the two transmission paths, because the lines may have to be run in different layers of interconnect or may have spatial variations in dielectric constant, and because of non-homogeneous transmission media like glass fiber based laminates. A secondary, though still significant, source of skew is the difference in the impedance and/or frequency response of the two paths in a differential lane. Such differences can arise because of the differences in parasitics loading the paths caused by proximity of components, vias, and co-planar grounds, among others.

SUMMARY OF THE INVENTION

A differential signal comprises a pair of complementary signals conveyed by a pair of lines of a differential lane, and when a differential lane forwards a differential signal from its transmitting end to its receiving end, edges of the complementary signals should preferably arrive concurrently at the receiving end. However, when a pair of lines have dissimilar path delays, the differential signal will be skewed at the receiving end in that edges of the complementary signals will not arrive concurrently at the receiving end. When a differential lane is terminated at its receiving end by a differential termination, any skew in the differential signal will produce signal reflections that affect the magnitudes, relative timing of edges, and the polarity of the complementary signals as viewed at the transmitting end in a manner indicating the nature of the skew at the receiving end.

The invention relates to a method or apparatus for reducing skew in the receiving end of a differential lane. In accordance with the invention, a skew correction system is incorporated into a transmitter supplying a differential signal as input to a differential lane. With a differential termination at the receiving end of the differential lane, the skew correction system monitors the differential signal at transmitting end to determine how, if at all, it is influenced by returning signal reflections, and based on the nature of the determined influence, adjusts the relative timing of complementary edges of the differential signal departing the transmitter so as to reduce skew at the receiving end of the differential lane.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

BRIEF DESCRIPTION OF THE DRAWINGS

FIG. 13 is a block diagram illustrating the response of a matched single ended transmission line.

FIG. 18 is a schematic diagram illustrating an ordinary differential driver stage.

FIG. 19 is a schematic diagram illustrating a differential driver stage for use with the skew corrector.

DETAILED DESCRIPTION OF THE INVENTION

Figure 1:
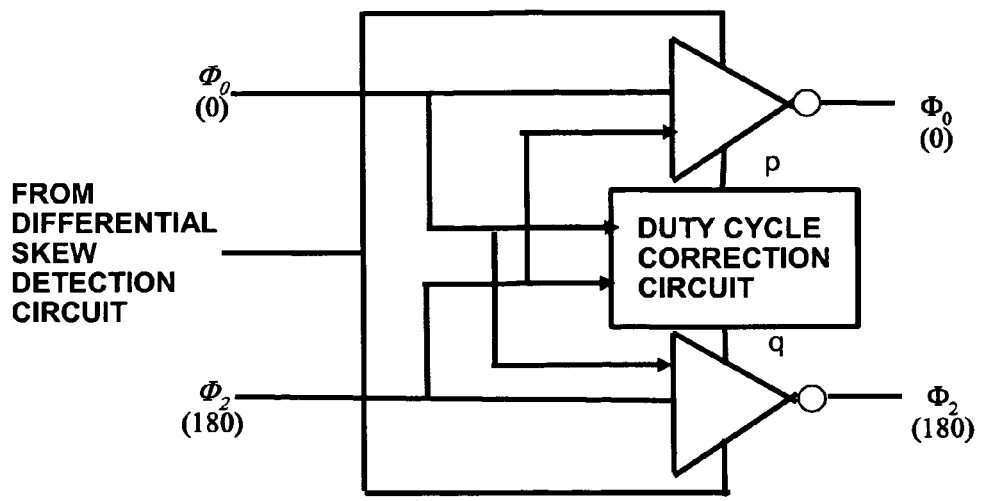
FIGS. 1 and 2 are block and schematic diagrams illustrating a prior art method for controlling differential skew.
Figure 2:
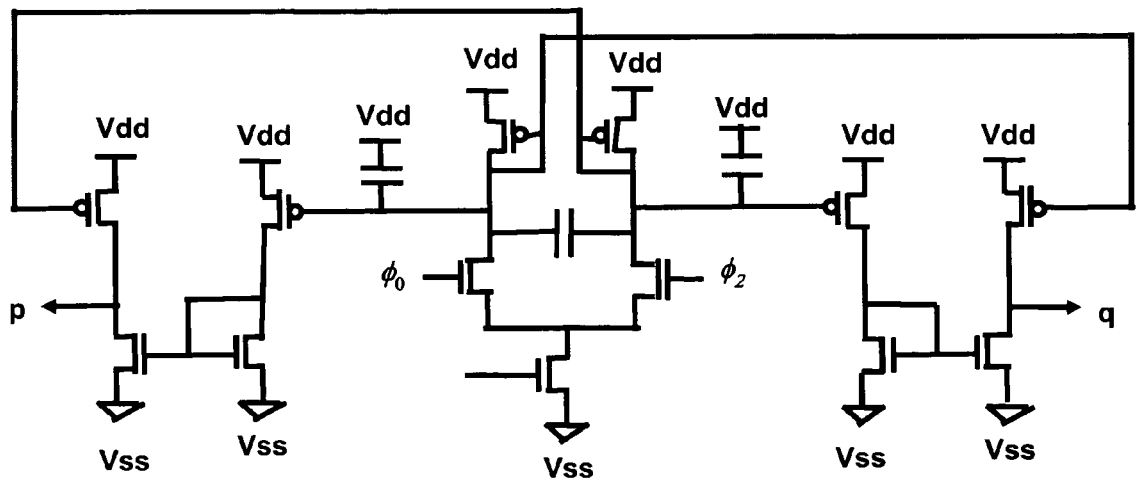
Figure 3:
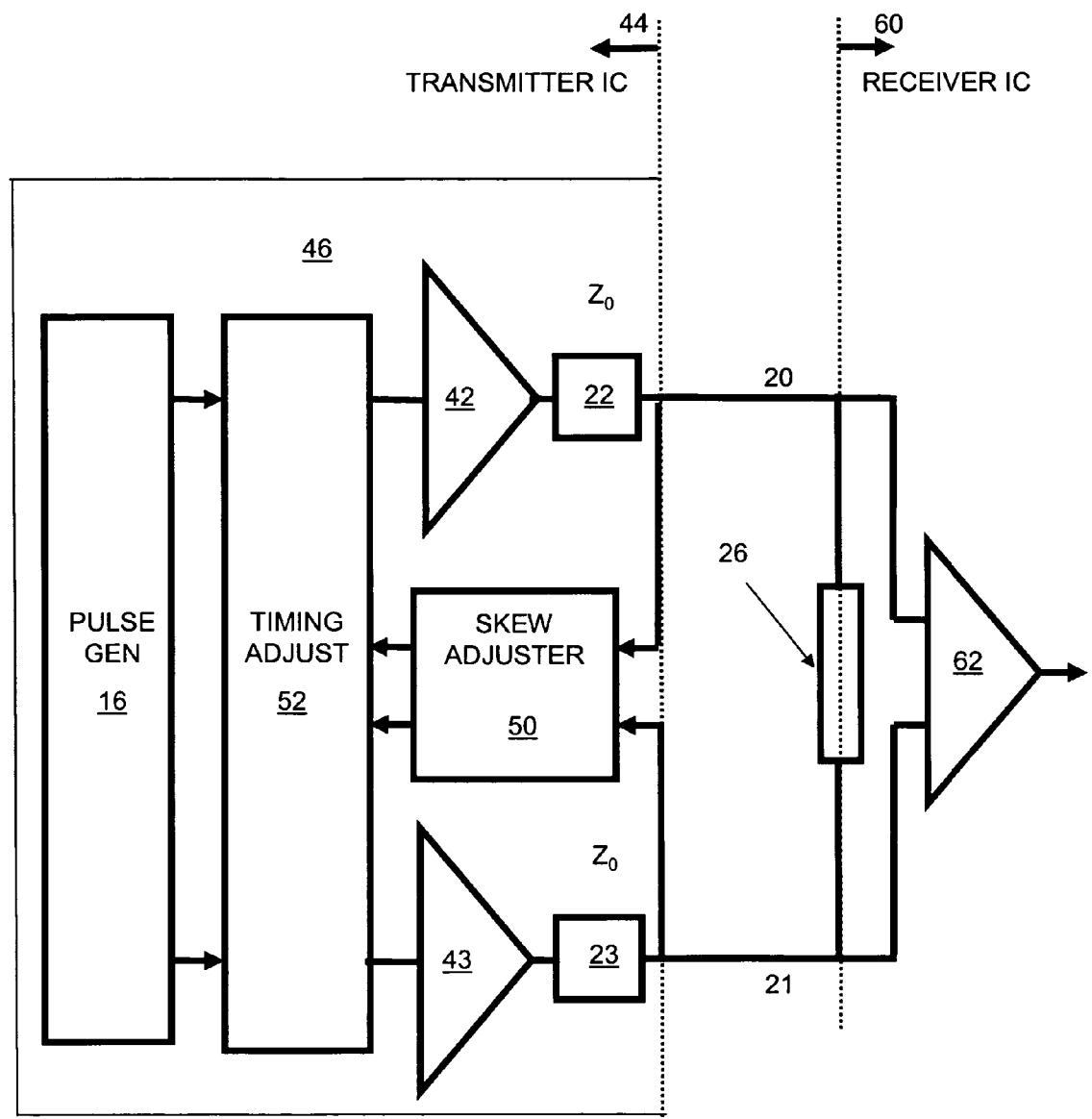
FIG. 3 is a block diagram illustrating the differential skew correction method of this invention.

FIG. 3 depicts a transmitter IC 44 for transmitting a differential signal to a receiver IC 60 via a differential lane formed by a pair of lines 20 and 21. The receiver ends of the lines 20 and 21 are connected to a termination 26, and a differential input circuit 62 of receiver IC 60. Complementary edges of the differential signal on lines 20 and 21 ideally should arrive concurrently at receiver 60, but due to differences in lines 20 or 21, the complimentary edges can arrive at different times. When the timing of the differential signal arriving at receiver 60 exhibits such skew, termination 26 reflects the signal edges back toward transmitter 44.

Transmitter IC 44 includes a skew correction system 46 in accordance with the invention that monitors the signal reflections returning to transmitter 44 to detect any skew in the differential signal input to receiver IC 60 and adjusts the relative timing of the complementary signal edges as they depart transmitter IC 44 to eliminate the detected reflections, thereby minimizing skew at the receiver end of the differential lane.

Skew correction system 46 includes a skew adjuster 52 receiving and adjustably delaying complementary edges of a differential signal from a pulse generator 16 to supply a differential signal to a pair of drivers 42 and 43 for buffering the signal onto lines 20 and 21 through a pair of reverse terminations 22 and 23. A skew sensor 50 detects which of lines 20 and 21 conveys a reflection that increases the magnitude of the signal on that line thereby indicating that skew at the receiving end of the differential lane makes that line appear shorter than the other line. Skew sensor 50 therefore signals skew adjuster 52 to retard the input of that line and/or advance the input of the other line in order to eliminate the reflection.

Figure 21:
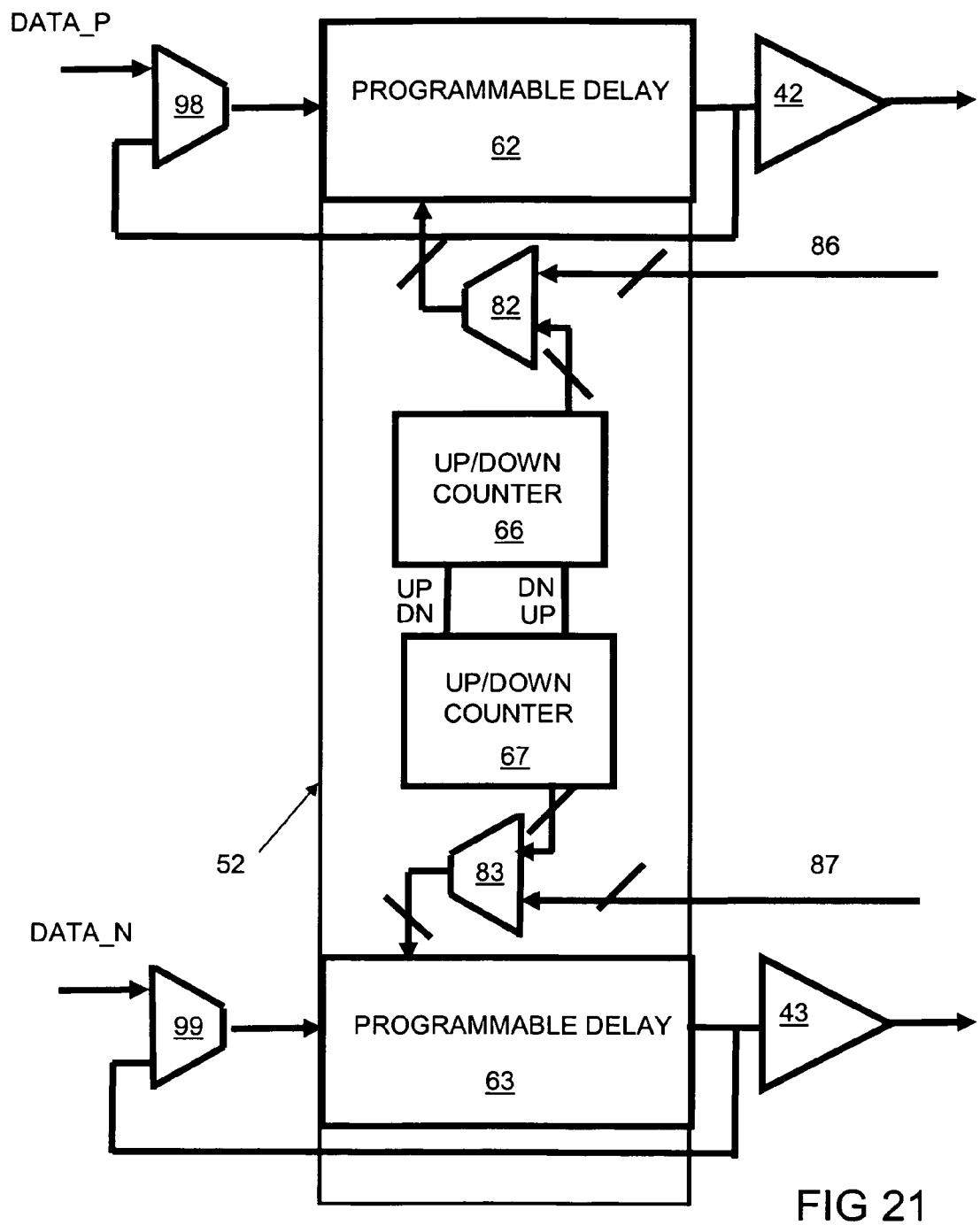
FIG. 21 is a block diagram illustrating a circuit for calibrating of the skew adjuster.

Because there are limits to the detectability of narrow pulses in signals which are created by relatively small amounts of skew, skew adjuster 52 may be calibrated and the measurements of the limits of detectable skew on both sides of the zero skew point are noted. The noted measurements may then be averaged to yield the setting required for zero skew. Calibration establishes the relationship between the control signal latched in the counters and the variable delay in the respective channel. This calibration can be accomplished in many ways, but preferentially as shown in FIG. 21 by selecting the feedback inputs of multiplexers 98 and 99, causing the delay lines 62 and 63 to oscillate in a closed loop at a frequency equal to 1/(2*TD), where TD is the time delay of the delay line. In this manner, the time delay for each control code supplied on lines 86 and 87, through multiplexers 82 and 83 respectively, on both delay lines can be easily determined by observing the output frequency from buffers 42 and 43, respectively, for each such supplied code.

Figure 4:
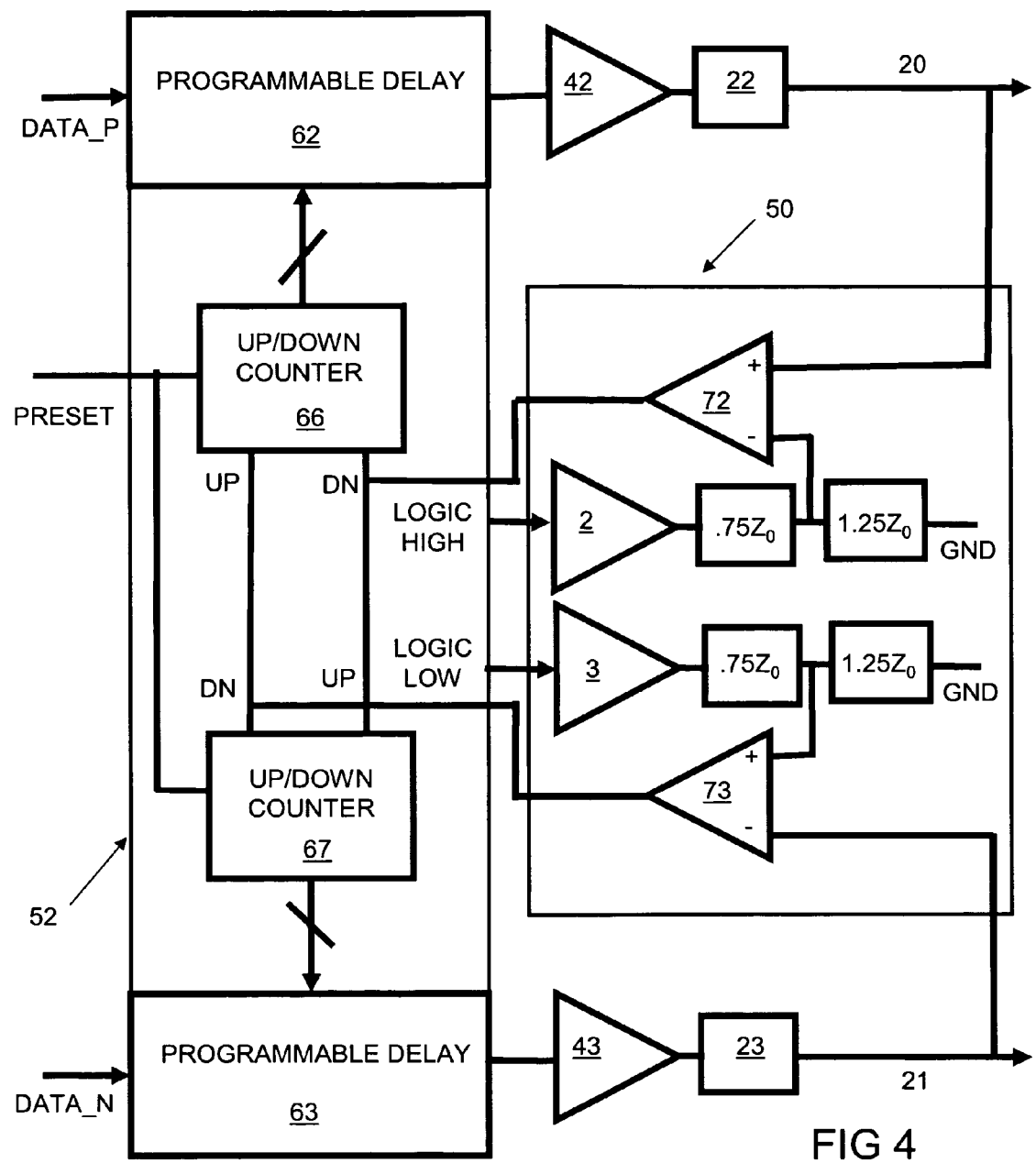
FIG. 4 is a block diagram illustrating details of the skew sensor and skew adjuster of FIG. 3.

FIG. 4 is an example implementation of skew sensor 50 and skew adjuster 52. Drivers 42 and 43 drive the inputs of lines 20 and 21 through back terminating resistors 22 and 23, respectively. Buffers 2 and 3 are used to generate a static voltage equal to the high and low levels of the outputs from drivers 42 and 43, respectively. The resistor networks connected to the outputs of 2 and 3 cause these buffers to have the same load impedance as 42 and 43, but they are computed to generate a voltage at the midpoints of each of the two resistor pairs that is mid-way between the normal driven levels on lines 20 and 21 and the level that exists when there is a reflection on these lines as a result of skew. Schmidt comparators, 72 and 73, sense any reflections that increase the voltage magnitude to threshold levels 1.25 times the magnitude of the transmitted voltage level at the inputs of lines 20 and 21. The up/down counters are crafted to count only once for each pulse edge originally transmitted down lines 20 and 21. The first such circuit of 72 or 73 to respond to a reflection will switch and cause the up/down counters to advance or retard their counts by one, changing the delay of the programmable delays in such a way as to reduce the reflection duration, thereby reducing the skew which caused the reflection. (Note that the up/down counters are preset to mid-range at initialization.) The sequence of operations is repeated with the emission of the next differential pulse signal from the pulse generator 16. The sequence continues to repeat until the detectable limit of skew is reached.

Figure 5:
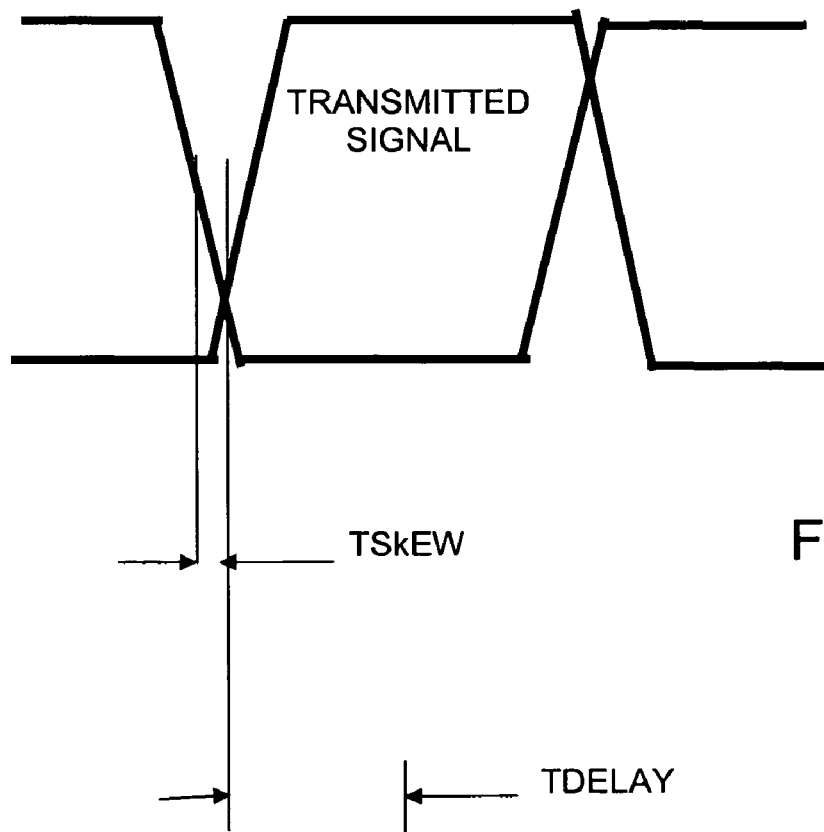
FIG. 5 is a timing diagram illustrating appearance of skewed differential signals at the driver of FIG. 3.
Figure 6:
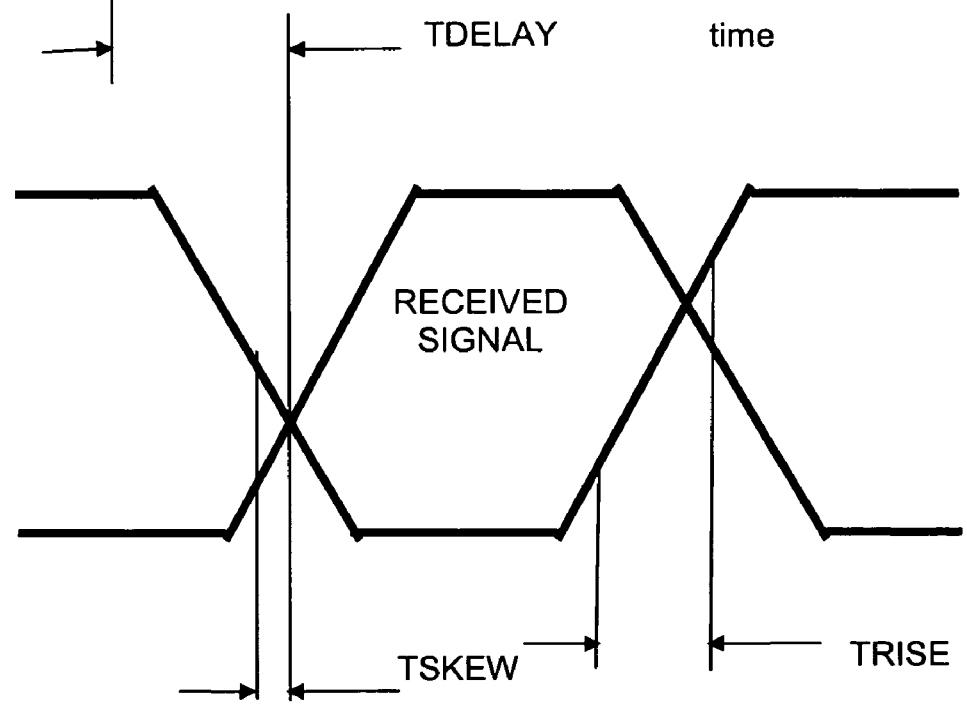
FIG. 6 is a timing diagram illustrating the appearance of the skewed differential signals at the receiver of FIG. 3.
Figure 7:
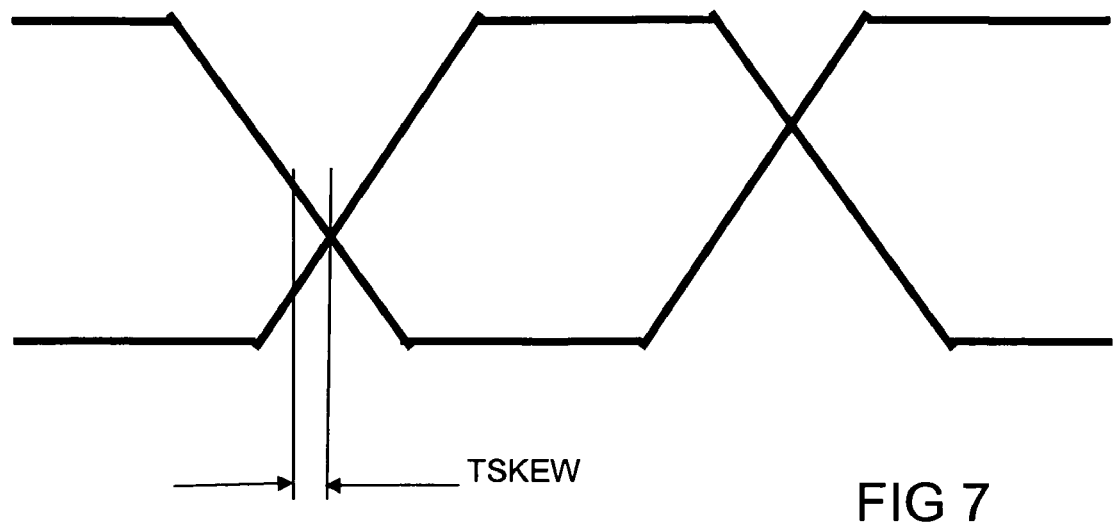
FIG. 7 is a timing diagram illustrating the received signal.

FIG. 5 illustrates skewed differential signals as they emerge from transmitter 44 of FIG. 3. As the length of the differential paths 20 and 21 grow the rise times at the receiving side of the paths also grow, as illustrated in FIG.

Figure 8:
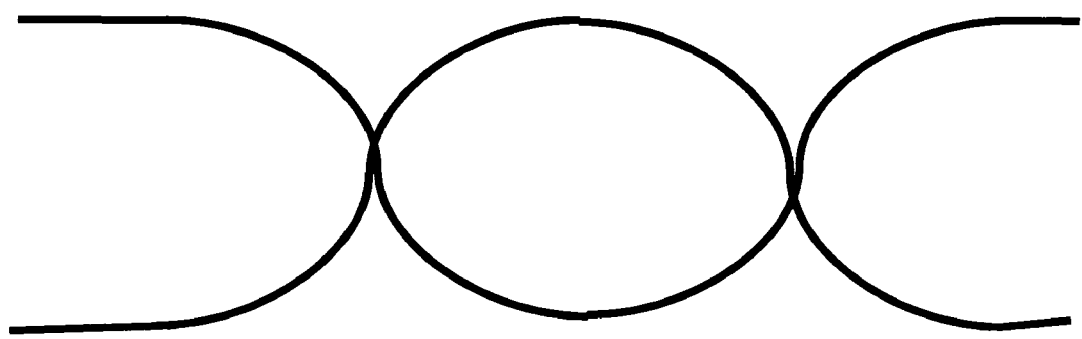
FIG. 8 is a timing diagram illustrating the effect of a differential equalizer on the received signal.
Figure 9:
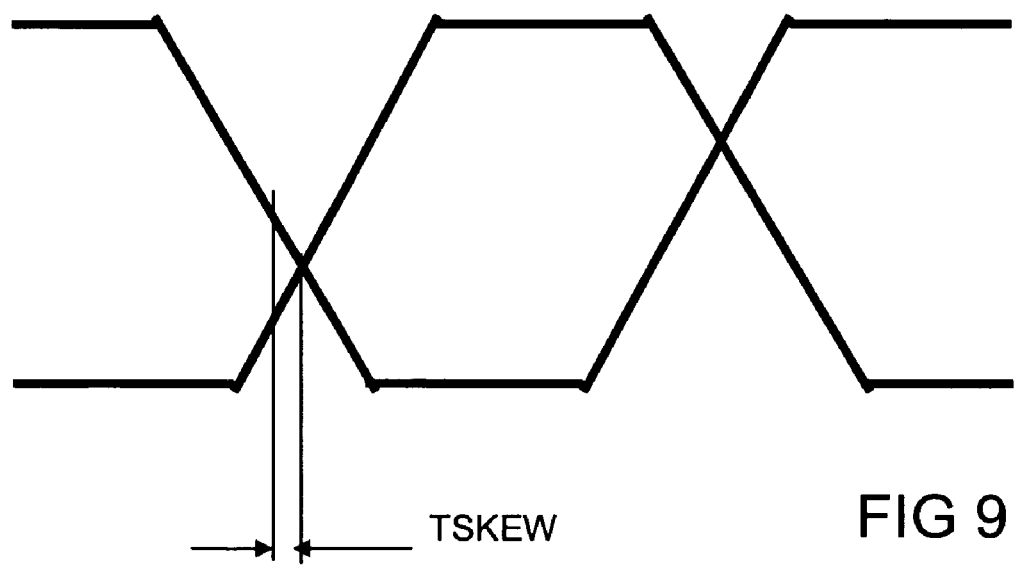
FIG. 9 is a timing diagram illustrating the received signal.
Figure 10:
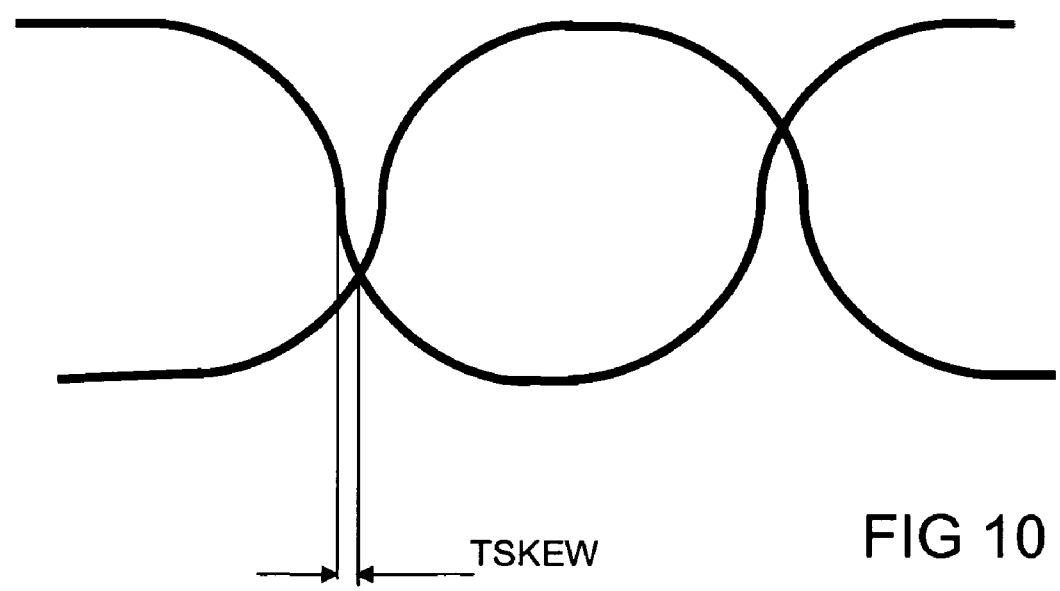
FIG. 10 is a timing diagram illustrating the effect of two single ended equalizers on the received signal.
Figure 11:
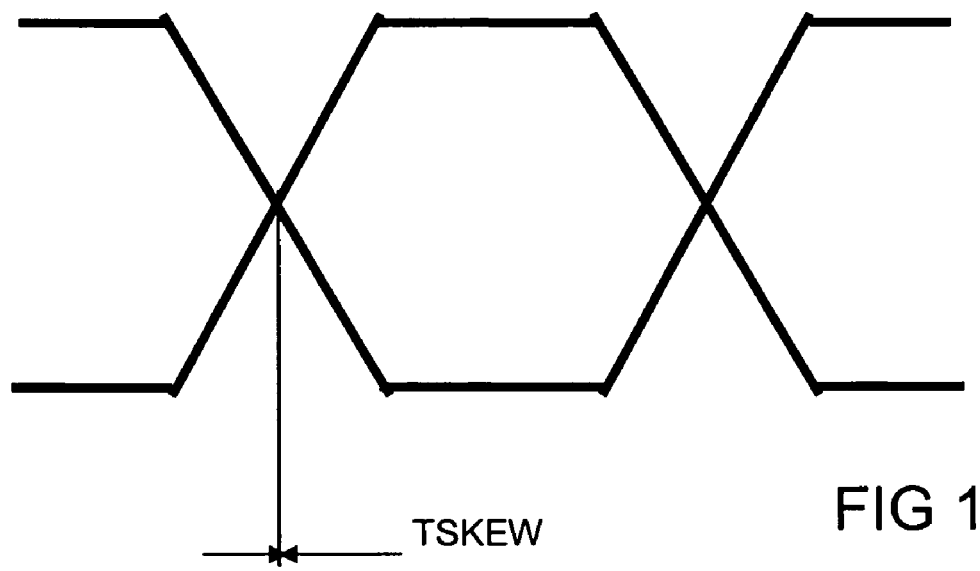
FIG. 11 is a timing diagram illustrating a de-skewed received signal.
Figure 12:
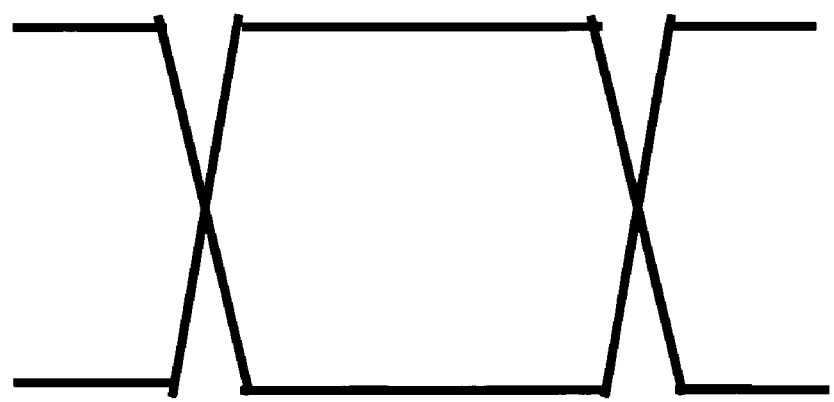
FIG. 12 is a timing diagram illustrating the effect of a differential equalizer on the received signal.

6, because of high frequency skin effect and dielectric losses. Thereby the skew between the differential paths may become a much smaller and seemingly insignificant part of the signal's rise time. Under these conditions one might deduce that the skew was no longer a problem. However, it has become customary in many applications to use receiver equalization on differential signals in an attempt to restore the rise time and pulse width of the received signal and thereby improve the signal to noise ratio and the resulting bit error rate. In FIG. 8, when such equalization is applied, the rise time does recover to a limited extent. In fact, it is found that the functionality of a differential equalizer (one that works on the difference between the two signals in a differential lane) is degraded by skew, so that it can not equalize the lane as well as two single ended equalizers, as shown in FIG. 10. But in using two single ended equalizers, the equalizers restore high grade signals that have significant skew between them, which is undesirable, as described above. In FIG. 11, the received signal is de-skewed. In FIG. 12, the de-skewed signal is equalized by a differential equalizer, creating a high quality signal with no skew. This invention solves the skew problems described in this paragraph.

FIG. 13 depicts the response of a matched transmission line, 20, to a unit step input supplied by pulse generator 18. Since the line is matched at the input and output by source termination 22 and load termination 24 respectively, the response consists of a voltage wave 30, of amplitude 0.5 that propagates from the input to the output, without any reflections.

Figure 14:
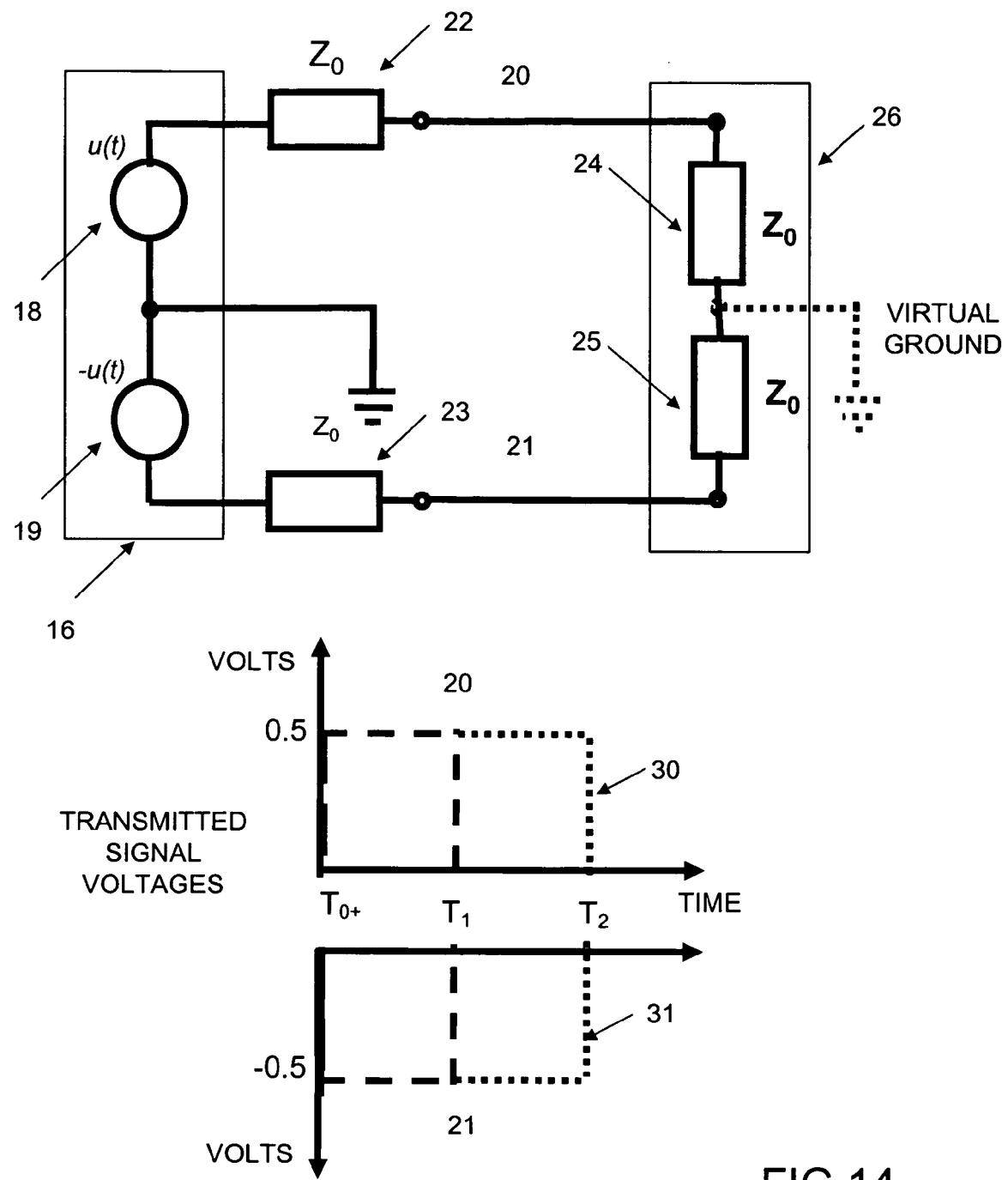
FIG. 14 is a timing diagram illustrating the response of matched differential transmission lines.

FIG. 14 depicts the response of a matched differential transmission lane (consisting of two transmission lines, 20 and 21, or a differential two conductor transmission line— e.g. parallel wire line) to differential unit step inputs supplied by generators 18 and 19, which together constitute a differential pulse generator, 16. Since the lines are matched at the input, by source terminations 22 and 23, and output, by load terminations 24 and 25, the response consists of voltage waves 30 and 31, of amplitude +/−0.5, respectively, that propagate from the input to the output, without any reflections. Note here that the far end termination 26, consists of two series resistors 24 and 25, of value Zo, but since the lines and signals are balanced, there is a virtual ground at the junction of the two resistors, and the circuit behaves as if each of the resistors were connected from their respective lines to ground.

Figure 15:
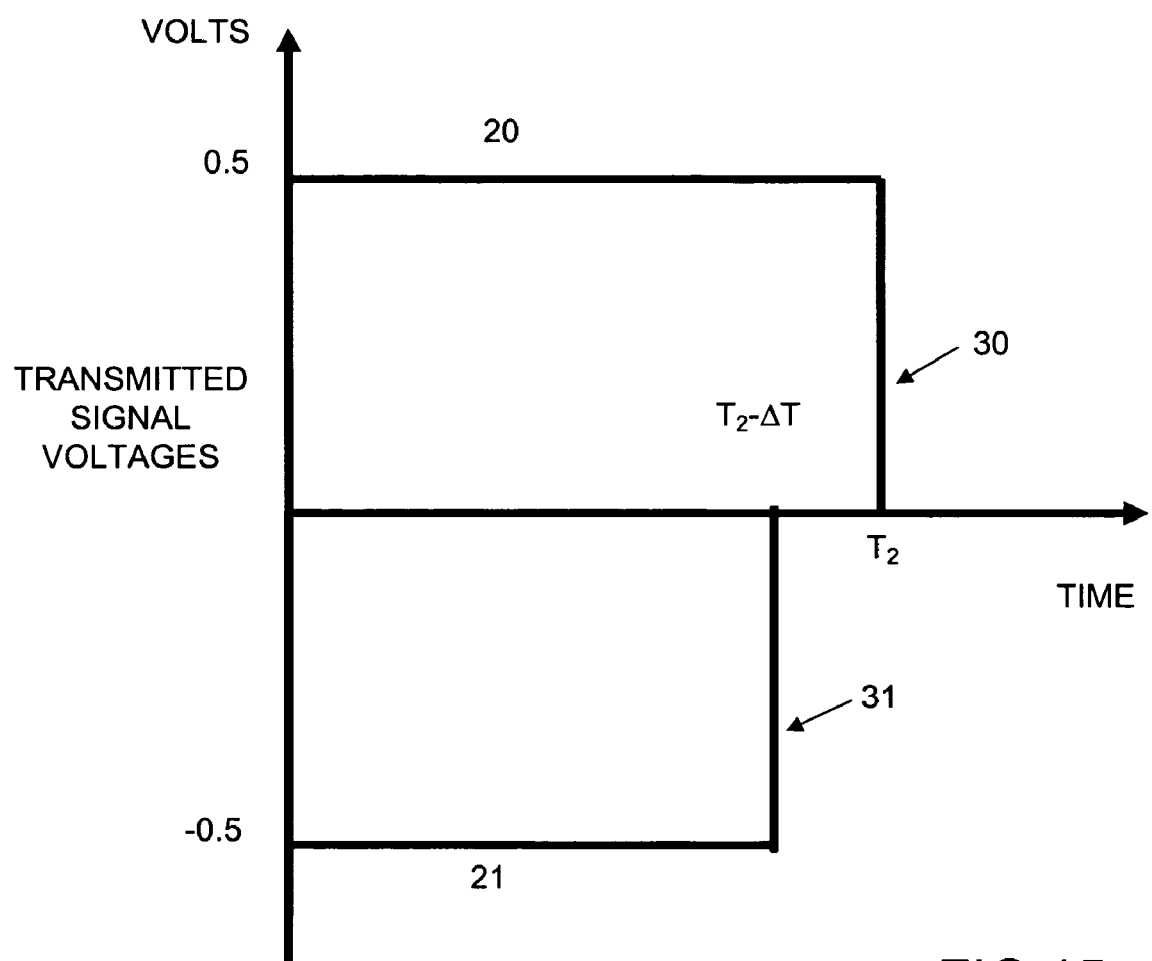
FIG. 15 is a timing diagram illustrating the voltage on the lines resulting from skewed inputs.

FIG. 15 depicts the response of a matched differential transmission lane, consisting of transmission lines 20 and 21, to differential unit step inputs supplied by differential pulse generator 16, which have become skewed. The signals are depicted just as the first signal 30, reaches the far end of the line.

Figure 16:
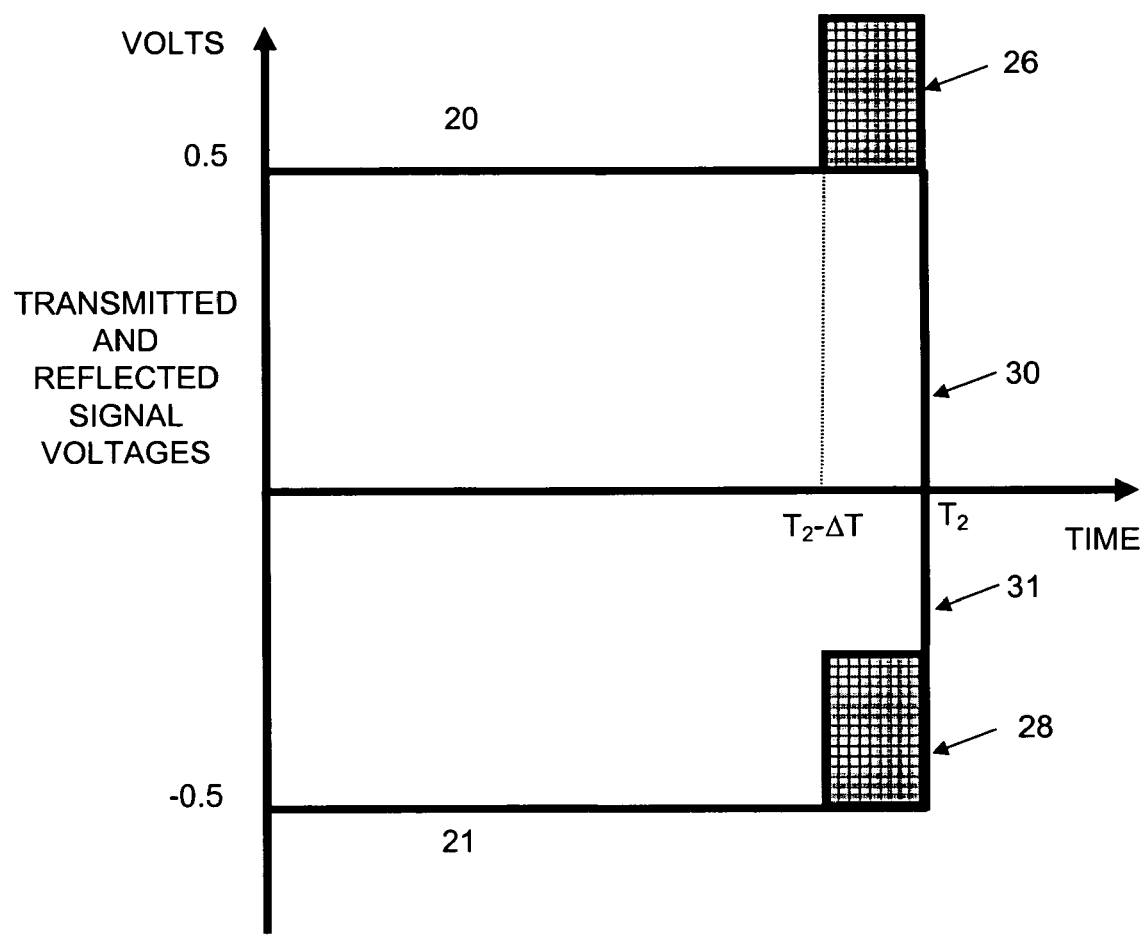
FIG. 16 is a timing diagram illustrating the reflections on the lines after the signals have both arrived.

FIG. 16 depicts the response of a matched differential transmission lane to differential unit step inputs, which have somehow become skewed. The signals are depicted just as the second signal reaches the far end of the line. What has occurred is that the signal that arrived first saw a termination of 3Zo to ground because of the physical 2Zo termination resistance and the Zo of the other transmission line—which has zero volts on it at this time. This led to a reflection voltage coefficient of:

$$Kr=(Zt-Zo)/(Zt+Zo)=(3Zo-Zo)/(3Zo+Zo)=0.5$$

This reflection 26, travels back towards the input of the line. Simultaneous with the reflection on transmission line 20, which increases the voltage on line 20, a signal is created on transmission line 21 by the termination current in line 20. This reflection, 28, is the same size as the reflected signal in line 20, but it reduces the magnitude of the voltage on line 21, rather than increasing it—as is the case with line 20. At time T2 plus deltaT, line 21 finally receives the input step, the virtual ground occurs at the junction of the two terminating resistors 24, and further reflections from the receiving end of the line are terminated.

Figure 17:
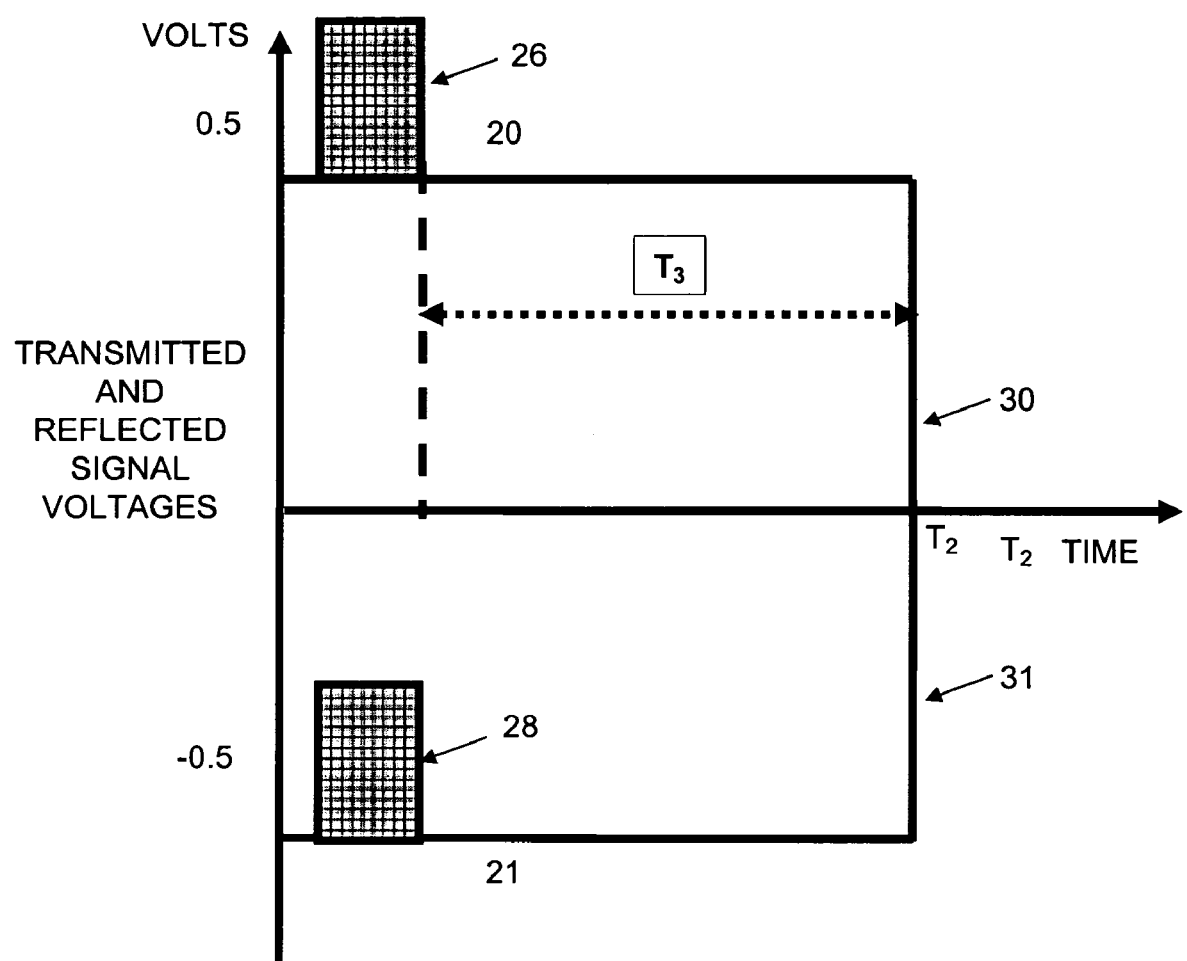
FIG. 17 is a timing diagram illustrating the reflections just before they arrive back at the driver.

FIG. 17 depicts the progress of the reflected waves, 26 and 28, towards the transmitting end of lines 20 and 21, where they will be sensed by the skew sensor 50 in the transmitter 44.

The logic circuits in the main signal path of FIG. 4 are shown as single ended, for simplicity, however for best signal integrity they should all be implemented as differential. FIG. 18 shows a common output driver for differential applications, including back terminations 22 and 23. The preferred differential implementation 42, is shown in FIG. 19. Note that the circuit of FIG. 18 works well when the two inputs have identical timing. In the present instance, however, the inputs will generally have markedly different timing because they are being adjusted to compensate for skew.

The circuit of FIG. 19 works well for this situation and has the additional advantage that the total power supply current is constant, irrespective of timing.

The system is shown using a unit step input. After the reflection and skew correction action appropriate to a step input, the counters are frozen or disabled, the step is reset to zero, and after a short settling time (to allow for reflections that occur during the reset) the counters are re-enabled and a new step can be issued. By repetitive action, the skew at the receiver is thereby eliminated. Those of skill in the art will appreciate that a variety of other means could be used to implement the sequencing of the skew correction, and other types of signals could be used—other than a step. For example, rather than sensing the magnitude of the reflections, skew sensor 50 could observe the polarities of the reflections or could observe an order of arrival of reflection edges and determine how to adjust skew adjuster 52 to minimize skew based on either of those observations.

Figure 20:
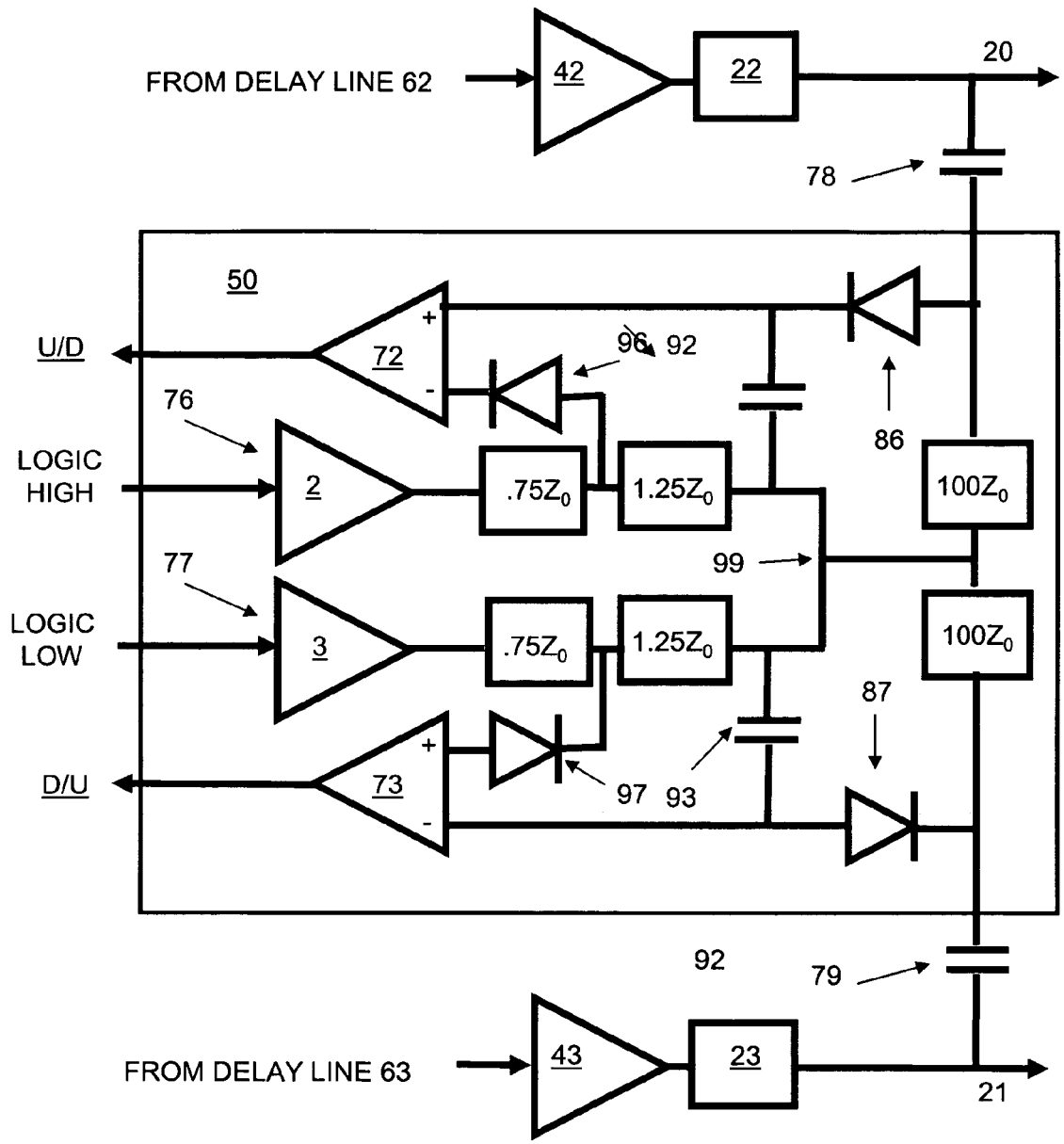
FIG. 20 is a block diagram illustrating details of a preferred skew sensor of FIG. 19.

Clearly, skew sensor 50 of FIG. 4 must sense a combination of the sequence of receipt of the reflections and the magnitude of reflections—otherwise, the receipt of two reflections in rapid sequence would confuse it. An example of an alternative skew sensor is shown in FIG. 20. Here skew sensor 50 uses detected and filtered versions of the reflected signals to activate the up/down counter controls. Detector diode 86 is coupled to line 20 by coupling capacitor 78 and the resistor (100Z0) connected from capacitor 78 to node 99, which is set at the common mode voltage of the logic signals on the lines 20 and 21. The positive edge of the step emitted from driver 22 charges capacitor 92 to the equivalent of the output voltage level on line 20 just after the step transition. A subsequent positive reflection from the differential termination between lines 20 and 21 will charge capacitor 92 to a higher voltage than is created by network created by the two resistors marked 1.25Z0, 0.75Z0, and diode 96. (Note that diode 96 compensates for the voltage drop created by diode 86 when it detects a reflected signal. Diode 97 has the same function respecting diode 87.) This will cause comparator 72 to switch, forcing the U/D line at its output to the U mode, thereby increasing the delay in delay line 62 and reducing the skew at the receiver. Similar circuitry containing diode 87 capacitor 79, and 93 and a resistor diode network, similar to the one associated with line 20, monitors line 21. However, on line 21 only negative reflections can activate the D/U line of delay line 63 because of the polarity of the diodes involved. This means that comparator 73 can only switch if line 21 carries the signal that arrives at the differential termination before that of line 20. The switching action of this comparator will result in an increase in the delay setting of delay line 63 thereby reducing the skew at the receiver end of lines 20 and 21.

The system described above can be used off-line, but it is also capable of being used on-line to correct for dynamic changes in skew caused by temperature drifts and power supply variation. One of many ways this can be done is through short interrupts of the normal flow of data, during which the skew correction is activated as described above.

The invention claimed is:

1. For a differential lane forwarding a differential signal arriving at its transmitting end to its receiving end, the differential lane being terminated at its receiving end such that any skew in the differential signal causes reflections of the differential signal to return from the receiving end to the transmitting end, an apparatus for reducing skew in the differential signal at the receiving end, the apparatus comprising:
   a skew adjuster circuit for adjustably skewing the differential signal at the transmitting end, and
   a skew detection circuit for monitoring reflections of the differential signal at the transmitting end and for signaling the skew adjuster circuit co adjust skew in the differential signal at the transmitting end so as to reduce skew in the differential signal at the receiving end, thereby reducing reflections in the differential signal at the transmitting end.

2. The apparatus in accordance with claim 1 wherein the skew detection circuit monitors reflections arriving at the transmitting end by monitoring a magnitude of the differential signal.

3. The apparatus in accordance with claim 1 wherein the skew detection circuit monitors polarity of the reflections arriving at the transmitting end.

4. The apparatus in accordance with claim 1 wherein the skew detection circuit monitors an order in which the reflections of complementary edges of differential signal reflections arrive at the transmitting end and determines the nature of any skew in the differential signal at the receiving end as a function of the monitored signs.

5. The apparatus in accordance with claim 1 wherein the differential lane comprises complementary first and second signals, wherein the differential lane comprises a first line for receiving the first signal and conveying it from the transmitting end to the receiving end and a second line for receiving the second signal and conveying the second signal from the transmitting end to the receiving end, and wherein the skew adjuster circuit comprises:
   a first programmable delay circuit for delaying reception of the first signal by the first line with a first delay controlled by first data;
   a second programmable delay circuit for delaying reception of the second signal by the second line with a second delay controlled by second data; and
   control means for responding to the skew detection circuit by adjusting the first data and second data.

6. The apparatus in accordance with claim 5 wherein the control means comprises:
   a first up/down counter for generating the first data in response to control signals from the skew detection circuit, and
   a second up/down counter for generating the second data in response to the control signals.

7. The apparatus in accordance with claim 1 the differential comprises complementary first and second signals, wherein the differential lane comprises a first line for receiving the first signal and conveying it from the transmitting end to the receiving end and a second line for receiving the second signal and conveying the second signal from the transmitting end to the receiving end, and wherein the skew detection circuit comprises:
   a first control circuit for signaling the skew adjuster circuit to adjust skew in the differential signal at the transmitting end when a magnitude of the first signal rises above a first threshold, and
   a second control circuit for signaling the skew adjuster circuit to adjust skew in the differential signal at the transmitting end when a magnitude of the second signal falls below a second threshold.

8. For a differential lane forwarding a differential signal arriving at its transmitting end to its receiving end, a method for reducing skew in the differential signal at the receiving end, the method comprising the steps of:
   a. terminating the differential lane at its receiving end with a differential termination such that any skew in the differential signal causes reflections of the differential signal to return from the receiving end to the transmitting end,
   b. detecting reflections of the differential signal at the transmitting end, and
   c. adjusting skew in the differential signal at the transmitting end of the differential lane in response to reflections detected at step b so as to reduce skew in the differential signal at the receiving end of the differential lane.

9. The method in accordance with claim 8 wherein the differential lane normally operates with single ended terminations at its receiving end and wherein step a comprises replacing the single ended terminations with the differential termination.

10. The method in accordance with claim 8 further comprising the step of
    d. iteratively repeating steps b and c.

11. The method in accordance with claim 8 wherein reflections in the differential signal are detected at step b by monitoring magnitudes of the differential signal at the transmitting end.

12. The method in accordance with claim 11 wherein step c comprises:
    adjusting skew in the differential signal at the transmitting end when a magnitude of the first signal crosses a first threshold level, and
    adjusting skew in the differential signal at the transmitting end when a magnitude of the second signal crosses a second threshold level.

13. The apparatus in accordance with claim 8 wherein the differential comprises complementary first and second signals, wherein the differential lane comprises a first line for receiving the first signal and conveying it from the transmitting end to the receiving end and a second line for receiving the second signal and conveying the second signal from the transmitting end to the receiving end, and wherein step c comprises the substeps of:
    c1. delaying reception of the first signal by the first line with a first delay controlled by first data;
    c2. delaying reception of the second signal by the second line with a second delay controlled by second data, and
    c3. adjusting the first data and second data In response to reflections detected at step b so as to reduce skew in the differential signal at the receiving end of the differential lane.

14. The apparatus in accordance with claim 13 wherein substep c3 comprises the substeps of: adjusting the first and second data when a magnitude of the first signal swings rises above a first threshold, and adjusting the first and second data when a magnitude of the second signal falls below a second threshold.

15. The method in accordance with claim 8 further comprising the step of:

d. measuring the skew in the differential signal at the receiving end by calibrating the skew, noting detectable limits of the skew and averaging the detectable limits to obtain a value of the skew.

* * * * *